US010622266B2

(12) United States Patent
Verduijn et al.

(10) Patent No.: US 10,622,266 B2
(45) Date of Patent: Apr. 14, 2020

(54) METHODS OF IDENTIFYING SPACE WITHIN INTEGRATED CIRCUIT STRUCTURE AS MANDREL SPACE OR NON-MANDREL SPACE

(71) Applicant: GLOBALFOUNDRIES INC., Grand Cayman (KY)

(72) Inventors: Erik A. Verduijn, Rensselaer, NY (US); Genevieve Beique, Clifton Park, NY (US); Nicholas V. LiCausi, Watervliet, NY (US); Lei Sun, Altamont, NY (US); Francis G. Goodwin, Halfmoon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 53 days.

(21) Appl. No.: 15/478,441

(22) Filed: Apr. 4, 2017

(65) Prior Publication Data
US 2018/0286681 A1 Oct. 4, 2018

(51) Int. Cl.
*H01L 21/66* (2006.01)
(52) U.S. Cl.
CPC .............. *H01L 22/20* (2013.01); *H01L 22/12* (2013.01)

(58) Field of Classification Search
None
See application file for complete search history.

(56) References Cited

U.S. PATENT DOCUMENTS

| 2003/0021463 | A1  | 1/2003 | Yamaguchi et al. |
| 2005/0207673 | A1  | 9/2005 | Takane et al. |
| 2006/0205223 | A1  | 9/2006 | Smayling |
| 2015/0126042 | A1* | 5/2015 | Pasquale ........... H01L 21/02274 438/761 |
| 2017/0040230 | A1* | 2/2017 | Yamaguchi ............. H01L 22/00 |

* cited by examiner

*Primary Examiner* — Moazzam Hossain
*Assistant Examiner* — Stanetta D Isaac
(74) *Attorney, Agent, or Firm* — Anthony Canale; Hoffman Warnick LLC

(57) ABSTRACT

The disclosure is directed to methods of identifying a space within an integrated circuit structure as a mandrel space or a non-mandrel space. One method may include: identifying a space between freestanding spacers as being one of: a former mandrel space created by removal of a mandrel from between the freestanding spacers or a non-mandrel space between adjacent mandrels prior to removal of the mandrel, based on a line width roughness of the space, wherein the line width roughness represents a deviation of a width of the space from a centerline axis along a length of the space.

11 Claims, 6 Drawing Sheets

METHODS OF IDENTIFYING SPACE WITHIN INTEGRATED CIRCUIT STRUCTURE AS MANDREL SPACE OR NON-MANDREL SPACE

BACKGROUND

Technical Field

The present disclosure relates to integrated circuit structures, or more particularly, to methods of identifying a space within an integrated circuit structure as a mandrel space or a non-mandrel space.

Related Art

In the microelectronics industry as well as in other industries involving construction of microscopic structures micromachines, magnetoresistive heads, continued desire to reduce the size of structural features and microelectronic devices and/or to provide greater amount of circuitry for a given chip size. Miniaturization in general allows for increased performance (more processing per clock cycle and less heat generated) at lower power levels and lower cost. Present technology is at atomic; level scaling of certain micro-devices such as logic gates, FITS and capacitors, for example. Circuit chips with hundreds of millions of such devices are common.

In order to achieve further size reductions exceeding the physical limits of trace lines and micro-devices that are embedded upon and within their semiconductor substrates, techniques that exceed lithographic capabilities have been employed. Sidewall image transfer (SIT), also known as self-aligned double patterning (SADP), is one such technique to generate sub-lithographic structures. SIT involves the usage of a sacrificial structure e.g., a mandrel, typically composed of a polycrystalline silicon and a sidewall spacer (such as silicon dioxide or silicon nitride, for example) having a thickness less than that permitted by the current lithographic ground rules formed on the sides of the mandrel (e.g., via oxidization or film deposition and etching). After removal of the mandrel, the remaining sidewall spacer is used as a hard mask (HM) to etch the layer(s) below, for example, with a directional reactive ion etch (RIE). Since the sidewall spacer has a sub-lithographic lateral dimension, width, (less than lithography allows), the structure formed in the layer below will also have a sub-lithographic lateral dimension.

SUMMARY

A first aspect of the disclosure is directed to a method. The method may include: identifying a space between freestanding spacers as being one of: a mandrel space created by removal of a mandrel from between the freestanding spacers or a non-mandrel space between adjacent mandrels prior to removal of the mandrel, based on a line width roughness of the space, wherein the line width roughness represents a deviation of a width of the space from a centerline axis along a length of the space.

A second aspect of the disclosure is directed to a method. The method may include: providing an integrated circuit structure having: a first mandrel over a substrate and a second mandrel over the substrate laterally adjacent to the first mandrel; a pair of spacers on opposing sides of each mandrel over the substrate; and a non-mandrel space between adjacent spacers of the first and second mandrels, removing each mandrel to expose the substrate thereunder, thereby defining a mandrel space between the pair of spacers of each mandrel; determining a line width roughness of each of the non-mandrel space and the mandrel space, wherein the line width roughness represents a deviation of a width of the space from a centerline axis along a length of the space; and identifying which space constitutes the non-mandrel space between the adjacent spacers and the mandrel space based on the line width roughness of the non-mandrel space and the mandrel space.

A third aspect of the disclosure is directed to a computer program product comprising a computer readable storage medium having program instructions embodied therewith, the program instructions executable by a computer device to cause the computer device to: identify a space between freestanding spacers as being one of: a mandrel space created by removal of a mandrel from between the freestanding spacers or a non-mandrel space between adjacent mandrels prior to removal of the mandrel, based on a line width roughness of the space, wherein the line width roughness represents a deviation of a width of the space from a centerline axis along a length of the space.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 1-8 show an integrated circuit structure according to embodiments of the disclosure, wherein FIGS. 1, 3, 5, and 7 show a top-down view of the integrated circuit structure and FIGS. 2, 4, 6, and 8 show a cross-sectional view of the integrated circuit structure taken along line A-A.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to integrated circuit structures, or more particularly, to methods of identifying a space within an integrated circuit structure as a mandrel space or a non-mandrel space. Specifically, mandrel and non-mandrel spaces may be identified by determining a line width roughness of each space. Once mandrel and non-mandrel spaces are identified, parameters of the integrated circuit structure design of a subsequently formed integrated circuit structure may be adjusted based on the identifying. Specifically, one of a depositing or an etching of a spacer material in a subsequently formed integrated circuit structure may be adjusted in order to reach a desired integrated circuit structure design. The present disclosure will now be described relative to an integrated circuit structure undergoing aspects of the methods, a flow diagram showing processes according to aspects of the methods, and a system for performing and/or implementing aspects of the methods.

Figure 1:
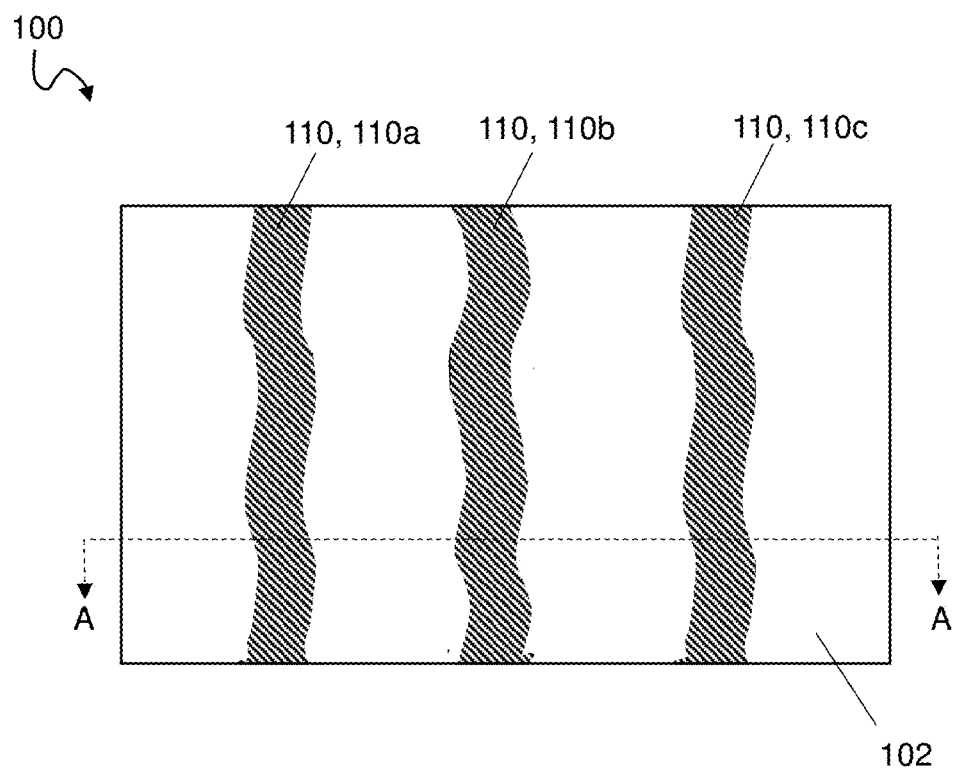
Figure 2:
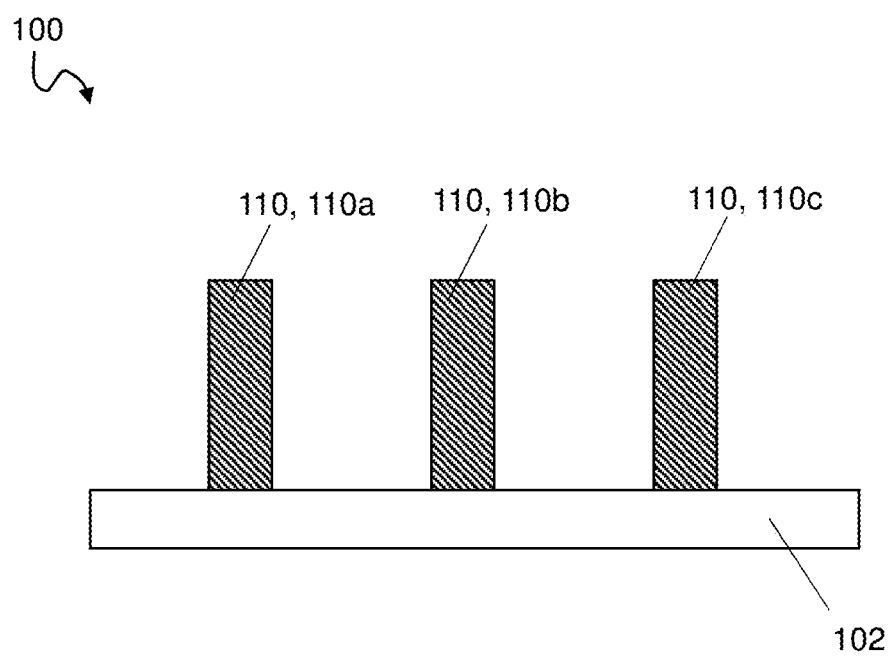

Turning now to FIGS. 1-2, a preliminary integrated circuit (IC) structure 100 is shown. IC structure 100 may include a substrate 102 having a plurality of mandrels 110 thereover. Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of substrate 102 may be strained. While substrate 102 is shown as including a single layer of semiconductor material, it is emphasized that the teachings of the disclosure are equally applicable to semiconductor-on-insulator (SOI) substrates. As known in the art, SOI substrates may include a semiconductor layer on an insulator layer on another semiconductor layer (not shown). The semiconductor layers of an SOI substrate may include any of the semiconductor substrate materials discussed herein. The insulator layer of the SOI substrate may include any now known or later developed SOI substrate insulator such as but not limited to silicon oxide.

Mandrel formation may be performed as part of a sidewall image transfer (SIT) process. While three mandrels 110a-c have been illustrated, it is understood that any number of mandrels may be provided. Mandrels 110a-c may be formed by depositing a sacrificial material and then patterning the sacrificial material into the plurality of material blocks in any now known or later developed manner. In one embodiment mandrels 110a-c, may include polysilicon, amorphous silicon, amorphous carbon, etc. "Depositing" may include any now known or later developed techniques appropriate for the material to be deposited including but are not limited to, for example: CVD, low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. The patterning may include using any conventional photoresist, exposing it and etching accordingly to create mandrels 110, followed by photoresist strip. As shown, the etching may result in an uneven formation of mandrels 110. That is, the etching may result in a non-uniform shape, or a deviation from a straight line, of mandrels 110 and sidewalls thereof.

As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

Figure 3:
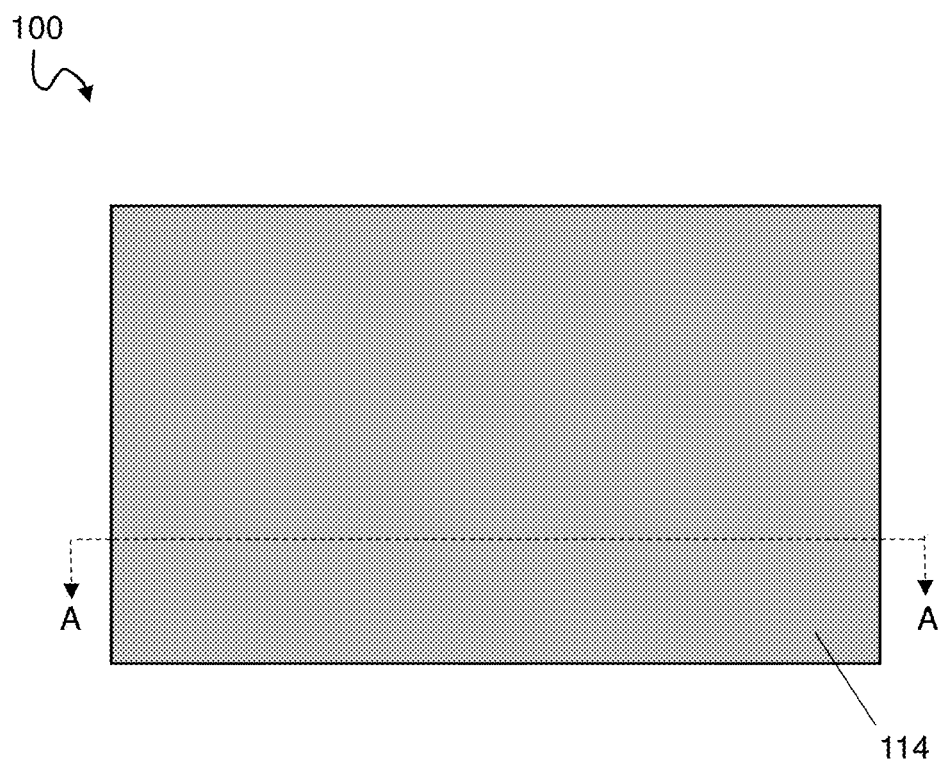
Figure 4:
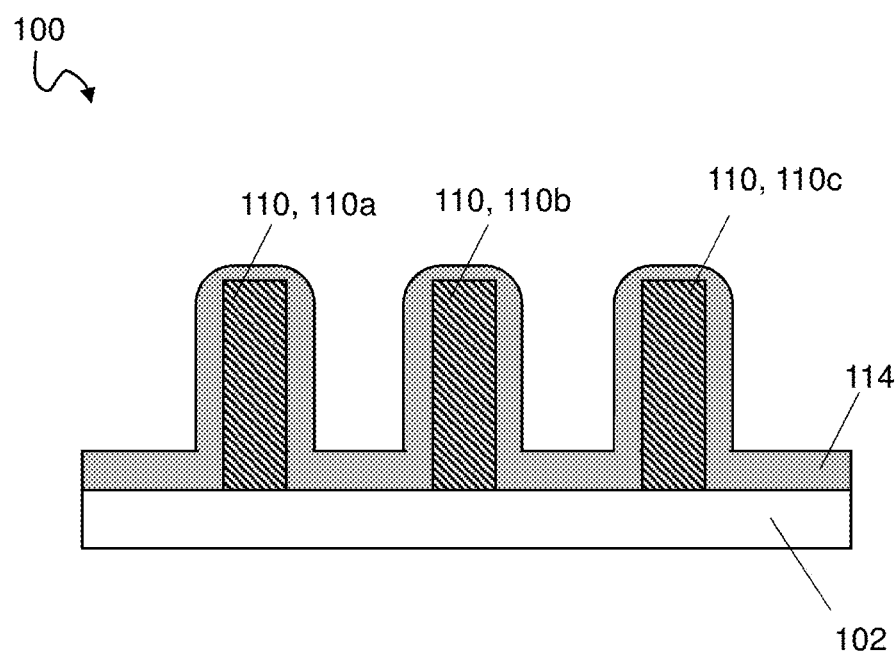

Turning now to FIGS. 3-4, a spacer material 114 may be conformally deposited over substrate 102 and mandrels 110 such that spacer material 114 substantially surrounds mandrels 110. Spacer material 114 may include any now known or later developed spacer material, such as, thin conformal oxide layer, such as silicon dioxide or silicon nitride.

Figure 5:
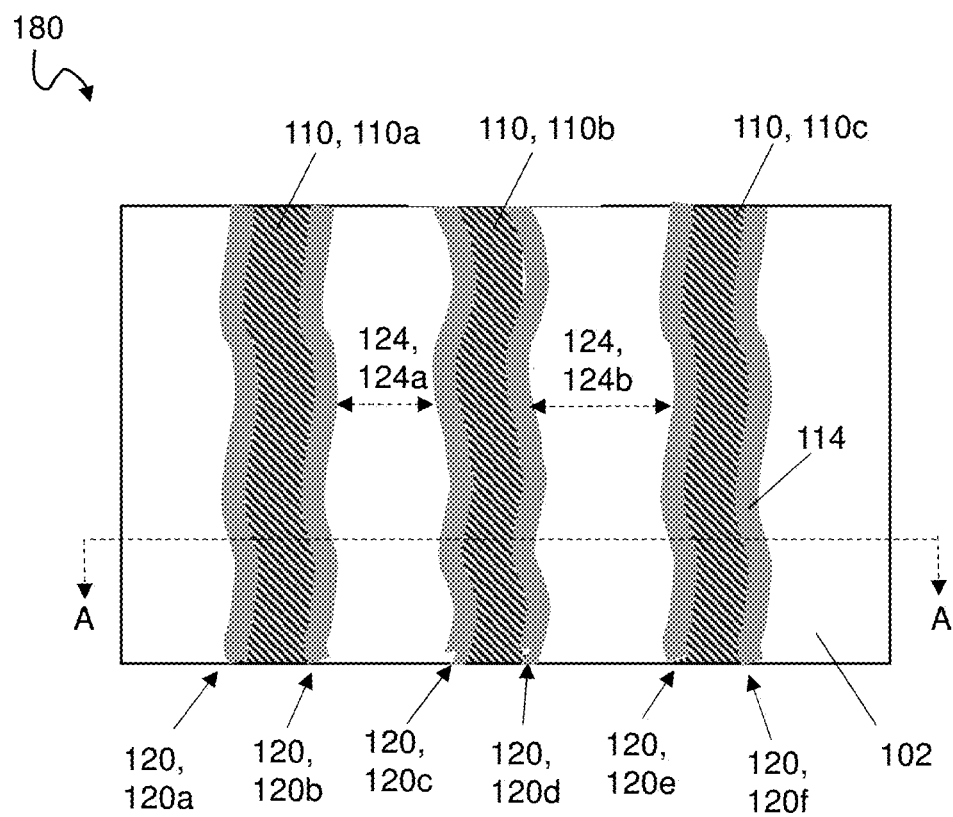
Figure 6:
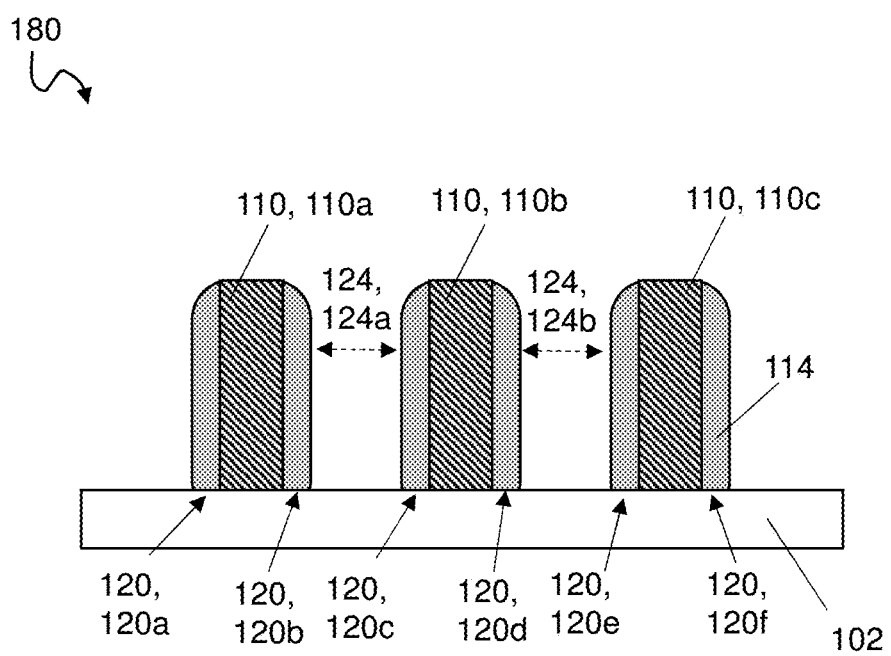

Turning now to FIGS. 5-6, spacer material 114 may be etched such that spacer material 114 is removed from a top surface of mandrels 110 thereby exposing a top surface of each mandrel 110. Additionally, a substantial portion of spacer material 114 may be removed from a top surface of substrate 102 between adjacent mandrels 110. However, a portion of spacer material 114 may remain immediately adjacent to, and aligning sidewalls of, mandrels 110. As a result, spacers 120 are formed. More particularly, a pair of spacers 120 are formed on opposing sides of each mandrel 110. In addition, non-mandrel spaces 124 are defined between adjacent spacers 120 of adjacent pairs of mandrels 110.

In other embodiments of the disclosure, the methods described herein may begin with IC structure 180 shown in FIGS. 5-6 such that the methods may include providing an IC structure 180 to an IC structure fabricator. IC structure 180 may include mandrels 110 over substrate 102 laterally adjacent to each other; pair of spacers 120 on opposing sides of each mandrel over substrate 102; and non-mandrel spaces 124 between adjacent spacers 120 of each mandrel 110. More specifically, non-mandrel space 124a may be defined between spacer 120b of corresponding mandrel 110a and spacer 120c of corresponding mandrel 110b. Additionally, non-mandrel space 124b may be defined between spacer 120d of corresponding mandrel 110b and spacer 120e of corresponding mandrel 110c.

Figure 7:
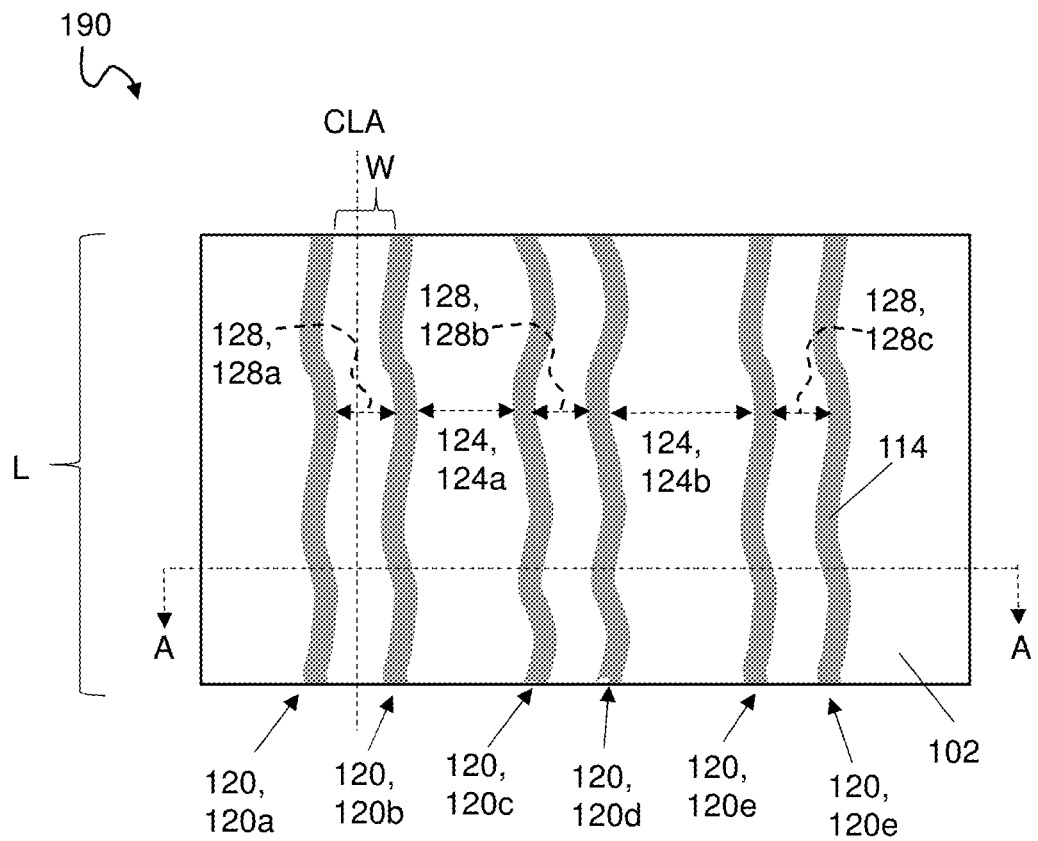
Figure 8:
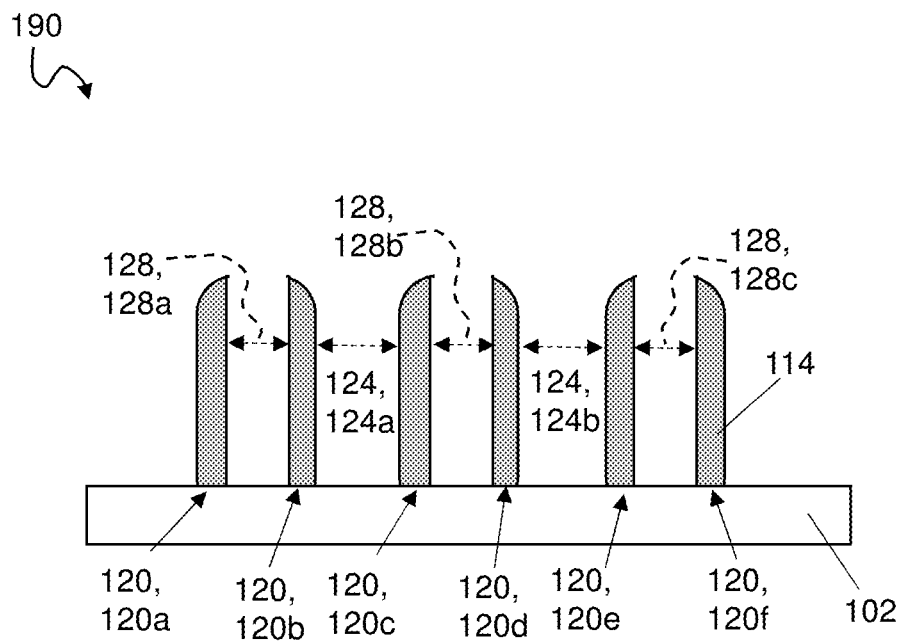

As shown in FIGS. 7-8, mandrels 110 may be removed to expose substrate 102 thereunder such that spacers 120 remain and include freestanding spacers 120a-f thereby creating a resulting IC structure 190. As a result, mandrel spaces 128 are defined between adjacent spacers 120 of each pair of spacers 120 of each corresponding mandrel 110. For example, mandrel space 128a may be defined between spacer 120a and spacer 120b of corresponding mandrel 110a (FIGS. 5-6), mandrel space 128b may be defined between spacer 120c and 120d of corresponding mandrel 110b (FIGS. 5-6), and mandrel space 128c may be defined between spacer 120e and 120f of corresponding mandrel 110c (FIGS. 5-6). Each mandrel space 128 and non-mandrel space 124 may include a length of approximately 200 nanometers (nm) to approximately 10,000 nm. The SIT process may continue by using the remaining freestanding spacers 120 as a mask for forming sub-lithographic structures in substrate 102 (not shown).

An IC fabricator may need to determine which spaces are non-mandrel spaces 124 and which are mandrel spaces 128, e.g., to modify or adjust photolithography or deposition techniques in a subsequently formed IC structure. It may be unclear simply from looking at an image of IC structure 190 which spaces are non-mandrel spaces 124 and which are mandrel spaces 128. Therefore, methods according to embodiments of the disclosure may include determining a line width roughness of each space, e.g., each non-mandrel space 124 and each mandrel space 128. Additionally, methods according to embodiments of the disclosure may include identifying a respective space between freestanding spacers 120 as being one of a mandrel space 128 created by removal of a mandrel 110 (FIGS. 5-6) from between spacers 120 or a non-mandrel space 124, the latter of which exists between adjacent mandrels 110 prior to removal of mandrels 110 based on the line width roughness of the respective space. The line width roughness may represent a deviation of a width W of the respective space from a centerline axis CLA along a length L of the respective space. Line width roughness may be determined using, for example, at least one of: a scanning electron microscope (SEM), an atomic force microscope (AFM), an optical critical dimension (OCD) tool, or other top-down metrology tools. Line width roughness may be represented by the following equation:

$$LWR=3\sqrt{\sigma_{xR}^2+\sigma_{xL}^2-2\text{cov}(x_L,x_R)}$$ Equation 1 wherein LWR represents the line width roughness, $\sigma_{xR}$ represents the standard deviation of the line edge roughness of the right edge, $\sigma_{xL}$ represents the standard deviation of the line edge roughness of the left edge and $\text{cov}(x_L, x_R)$ represents the covariance between the left and right edge.

In a case where the line width roughness of the respective space is approximately equal to zero nm, the space may be identified as a mandrel space 128. Mandrel spaces 128 have a line width roughness of approximately zero nm due to the fact that conformal deposition of spacer material 114 results in spacers 120 to line and, therefore, follow the shape of the corresponding mandrel 110. As a result, the deviation of width W of mandrel space 128 is uniform. In other words, spacers 120 defining mandrel spaces 128 parallel one another. In a case where the line width roughness of the respective space is not approximately equal to zero nm, the space may be identified as a non-mandrel space 124. Non-mandrel spaces 124 may have a line width roughness that is not approximately equal to zero due to the fact that each of the spacers 120 that define the non-mandrel space 124 correspond to a different mandrel 110 which may not have the same outer shape. In other words, spacers 120 defining non-mandrel spaces 124 do not parallel one another. Consequently, spacers formed thereon do not have a uniform distance apart from one another. As a result, the deviation of width W of non-mandrel space 124 is non-uniform. That is, one spacer 120 may follow the shape of one mandrel 110, e.g., mandrel 110a, and another spacer 120 may follow a shape of another, differently shaped mandrel 110, e.g., mandrel 110b, resulting in a non-zero line width roughness of the space, e.g., space 124a. However, it is to be understood that the line width roughness of mandrel space 128 may not be equal to exactly zero, but in any case the line width roughness of mandrel space 128 will be less than a line width roughness than non-mandrel space 124. Said another way, the line width roughness of non-mandrel space 124 is greater than a line width roughness of mandrel space 128.

The methods may also include adjusting one of a depositing or an etching of a spacer material of additional freestanding spacers in a subsequently fabricated IC structure based on the identifying. That is, once the space has been identified as a non-mandrel or mandrel space, the IC fabricator is able to determine how to adjust the size of the space, the spacers, and/or the mandrels in a subsequently fabricated IC structure to obtain a desired space size, and therefore, a desired sub-lithographic structure size. For example, because mandrel spaces are formed by the removal of the mandrel between adjacent freestanding spacers, in order to adjust a size of a mandrel space, the IC fabricator can adjust a size of the mandrels in the subsequently fabricated IC structure. Additionally, because non-mandrel spaces are formed by the conformal deposition of a spacer material and an etching of the spacer material, in order to adjust a size of a non-mandrel space, the IC fabricator can adjust the amount of spacer material that is conformally deposited and/or the etching process in the subsequently fabricated IC structure.

Figure 9:
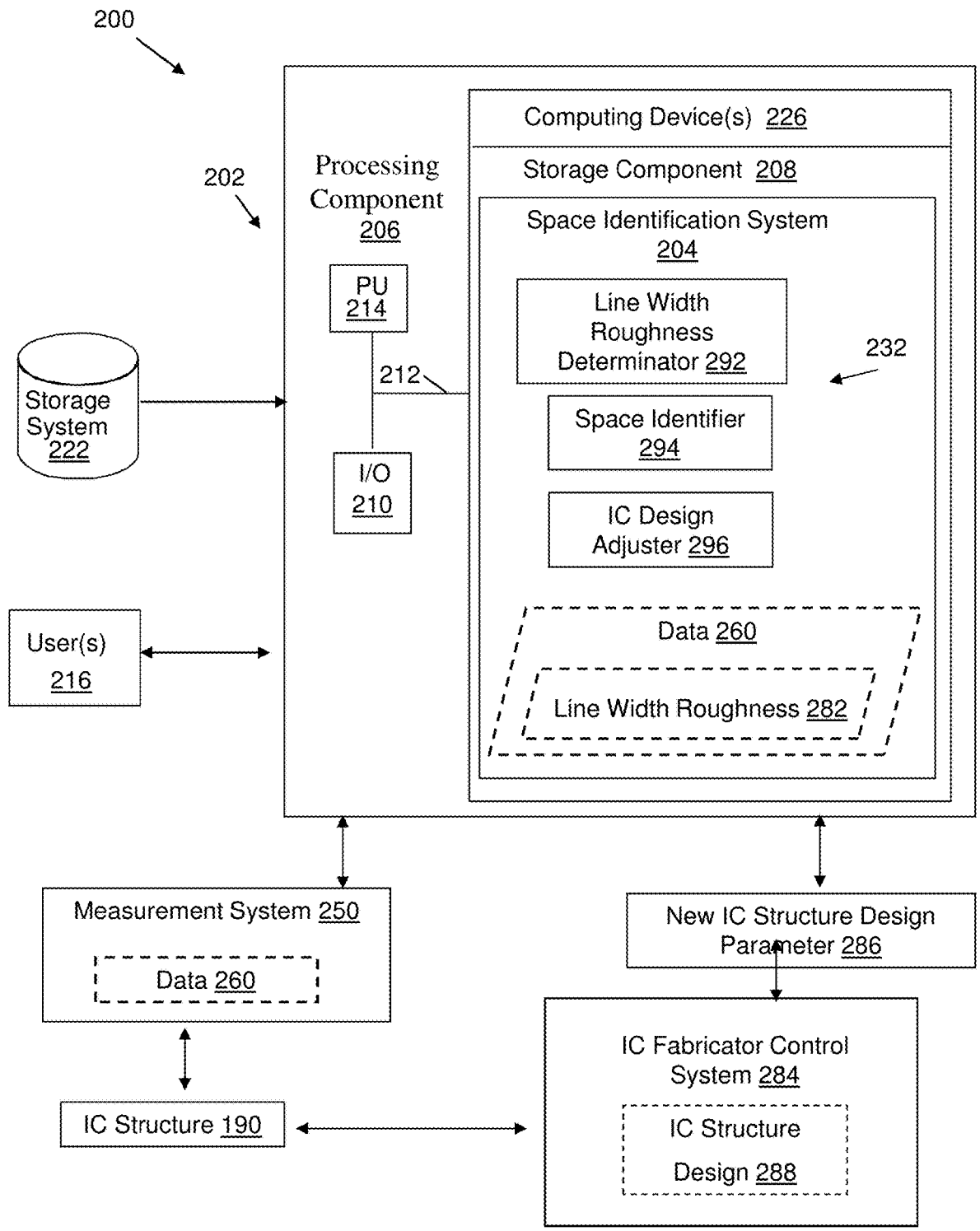
FIG. 9 shows a schematic depiction of a system according to various embodiments of the disclosure.

In FIG. 9, a system is shown including a space identification system, for performing the functions described herein according to various embodiments of the disclosure. To this extent, the system 200 includes computer system 202 that can perform one or more processes described herein in order to determine a line width roughness of spaces 124, 128 (FIGS. 7-8) in IC structure 190 (FIGS. 7-8), identify spaces in IC structure 190, and/or adjust one of a depositing or an etching of the spacer material in a subsequently fabricated IC structure. In particular, computer system 202 is shown as including the space identification system 204, which makes computer system 202 operable to identify spaces in IC structure 190 by performing any/all of the processes described herein and implementing any/all of the embodiments described herein.

The computer system 202 is shown including computing device 226, which can include a processing component 206 (e.g., one or more processors), a storage component 208 (e.g., a storage hierarchy), an input/output (I/O) component 210 (e.g., one or more I/O interfaces and/or devices), a processing unit (PU) 214, and a communications pathway 212. In general, the processing component 206 executes program code, such as the space identification system 204, which is at least partially fixed in the storage component 208. While executing program code, the processing component 206 can process data, which can result in reading and/or writing transformed data from/to the storage component 208, storage system 222, and/or the I/O component 210 for further processing. The pathway 212 provides a communications link between each of the components in the computer system 202. The I/O component 210 can comprise one or more human I/O devices, which enable a user (e.g., a human, and/or computerized user, e.g., an IC fabricator) 216 to interact with the computer system 202 and/or one or more communications devices to enable the system user 216 to communicate with the computer system 202 using any type of communications link. To this extent, the space identification system 204 can manage a set of interfaces (e.g., graphical user interface(s), application program interface, etc.) that enable human and/or system users 216 to interact with the space identification system 204. Further, space identification system 204 can manage (e.g., store, retrieve, create, manipulate, organize, present, etc.) data 260 from a measurement system 250, e.g., a SEM, such as image data (including SEM images of IC structure 190) and line width roughness data 282 using any solution, e.g., via wireless and/or hardwired means.

In any event, computer system 202 can comprise one or more general purpose computing articles of manufacture (e.g., computing devices) capable of executing program code, such as the space identification system 204, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the space identification system 204 can be embodied as any combination of system software and/or application software. It is further understood that the space identification system 204 can be implemented in a cloud-based computing environment, where one or more processes are performed at distinct computing devices (e.g., a plurality of computing devices 226), where one or more of those distinct computing devices may contain only some of the components shown and described with respect to the computing device 226 of FIG. 10.

Further, space identification system 204 can be implemented using a set of modules 232. In this case, a module 232 can enable the computer system 202 to perform a set of tasks used by the space identification system 204, and can be separately developed and/or implemented apart from other portions of the space identification system 204. As shown, modules 232 may include at least three modules including a line width roughness determinator 292, a space identifier 294, and an IC design adjuster 296.

Figure 10:
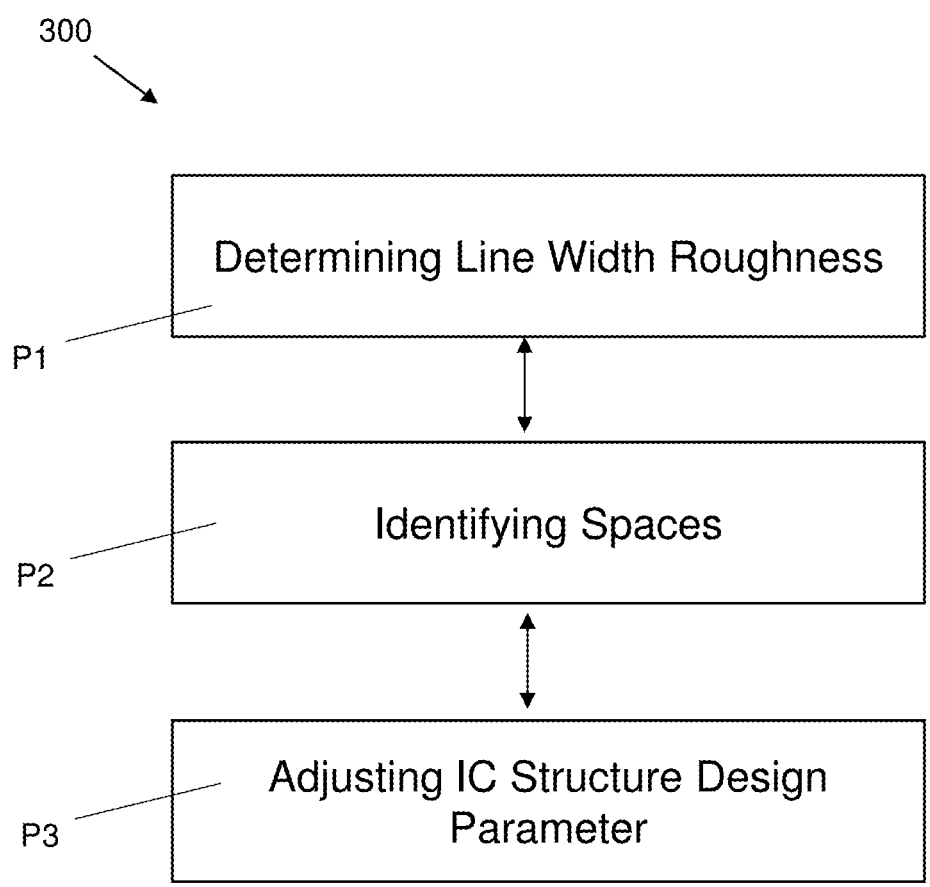
FIG. 10 shows a flow diagram of a method including processes according to various embodiments of the disclosure.

Turning now to FIG. 10, a flow diagram 300 is shown including processes of a method according to embodiments of the disclosure. The method according to this embodiment may include:

Process P1: line width roughness determinator 292 may determine a line width roughness of each space 124, 128 in IC structure 190 (FIGS. 7-8). As discussed herein, the line width roughness of each space 124, 128 may be determined by Equation 1 and may include using, e.g., a SEM, an AFM, or an OCD.

Process P2: space identifier 294 may identify each space 124, 128 as being one of a mandrel space 128 created by removal of a mandrel 110 (FIGS. 5-6) or a non-mandrel space 124 between mandrels 110 prior to removal of the mandrels 110, based on the line width roughness determined in process P1. In a case where the line width roughness of the respective space is approximately equal to zero nm, the space may be identified as a mandrel space 128. In a case where the line width roughness of the respective space is not approximately equal to zero nm, the space may be identified as a non-mandrel space 124. In any case, where a line width roughness of a first space is less than a line width roughness of another, adjacent space, the first space may be identified as a mandrel space 128. Said another way, in a case where a line width roughness of the first space is greater than a line width roughness of another, adjacent space, the first space may be identified as a non-mandrel space 124.

Process P3: IC design adjuster 296 may adjust a parameter, or indicate a parameter to be adjusted, during formation or fabrication of a subsequently formed IC structure such that a desired IC structure design is reached. More specifically, one of a depositing or an etching of a spacer material which is to form freestanding spacers in the subsequently formed IC structure may be adjusted and a new IC structure design parameter 286 may be provided to the IC fabricator and/or IC fabricator control system 288.

As used herein, the term "component" means any configuration of hardware, with or without software, which implements the functionality described in conjunction therewith using any solution, while the term "module" means program code that enables the computer system 202 to implement the functionality described in conjunction therewith using any solution. When fixed in a storage component 208 of a computer system 202 that includes a processing component 206, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 202.

When the computer system 202 comprises multiple computing devices, each computing device 226 may have only a portion of space identification system 204 fixed thereon (e.g., one or more modules 232). However, it is understood that the computer system 202 and space identification system 204 are only representative of various possible equivalent computer systems that may perform a process described herein. To this extent, in other embodiments, the functionality provided by the computer system 202 and space identification system 204 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 202 includes multiple computing devices 226, the computing devices can communicate over any type of communications link. Further, while performing a process described herein, the computer system 202 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

While shown and described herein as a method, computer program product and system for identifying spaces 124, 128 (FIGS. 7-8) in IC structure 190, it is understood that aspects of the disclosure further provide various alternative embodiments. For example, in one embodiment, disclosure provides a computer program fixed in at least one computer-readable medium, which when executed, enables a computer system to determine a line width roughness of spaces in IC structure 190, identify spaces in IC structure 190, and/or adjust one of a depositing or an etching of the spacer material in a subsequently fabricated IC structure. To this extent, the computer-readable medium includes program code, such as the space identification system 204, which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the disclosure provides a method of providing a copy of program code, such as the space identification system 204, which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the disclosure provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the disclosure provides a method of identifying spaces 124, 128 (FIGS. 7-8) in IC structure 190. In this case, a computer system, such as the computer system 202, can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

In still another embodiment, the disclosure provides for a computer program product comprising a computer readable storage medium (e.g., a non-transitory computer readable storage medium) having program instructions embodied therewith, the program instructions executable by a computer device to cause the computer device to: identify a space between freestanding spacers as being one of: a mandrel space created by removal of a mandrel from between the freestanding spacers or a non-mandrel space between adjacent mandrels prior to removal of the mandrel, based on a line width roughness of the space, wherein the line width roughness represents a deviation of a width of the space from a centerline axis along a length of the space.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
    identifying a space between freestanding spacers as being one of: a mandrel space created by removal of a mandrel from between the freestanding spacers or a non-mandrel space between adjacent mandrels prior to removal of the mandrel, based on a line width roughness of the space, wherein the line width roughness represents a deviation of a width of the space from a centerline axis along a length of the space, and wherein the identifying further includes:
        calculating the line width roughness of the space and a line width roughness of another, adjacent space positioned alongside one of the freestanding spacers,
        determining whether the line width roughness of the space is less than the line width roughness of the another, adjacent space,
        in response to the line width roughness of the space being less than the line width roughness of the another, adjacent space, identifying the space as the mandrel space, and
        in response to the line width roughness of the space not being less than the line width roughness of the another, adjacent space, identifying the space as the non-mandrel space.

2. The method of claim 1, further comprising:
    determining the line width roughness of the space using at least one of: a scanning electron microscope (SEM), an atomic force microscope (AFM), or an optical critical dimension (OCD) tool.

3. The method of claim 1, wherein the space includes a length of approximately 200 nanometers (nm) to approximately 10,000 nm.

4. The method of claim 1, further comprising:
adjusting one of a depositing or an etching of a spacer material of additional freestanding spacers in a subsequently fabricated integrated circuit structure based on the identifying.

5. The method of claim 1, wherein the line width roughness is calculated by the following equation:

$$LWR = 3\sqrt{\sigma_{xR}^2 + \sigma_{xL}^2 - 2\text{cov}(x_L, x_R)}$$

wherein LWR represents the line width roughness, $\sigma_{xR}$ represents standard deviation of the line edge roughness of the right edge, $\sigma_{xL}$ represents standard deviation of the line edge roughness of the left edge, and $\text{cov}(x_L, x_R)$ represents is the covariance between the left and right edge.

6. The method of claim 1, wherein the identifying is performed by a program product stored on a computer readable medium.

7. A method comprising:
providing an integrated circuit structure having:
a first mandrel over a substrate and a second mandrel over the substrate laterally adjacent to the first mandrel;
a pair of spacers on opposing sides of each mandrel over the substrate; and
a non-mandrel space between adjacent spacers of the first and second mandrels,
removing each mandrel to expose the substrate thereunder, thereby defining a mandrel space between the pair of spacers of each mandrel;
calculating a line width roughness of each of the non-mandrel space and the mandrel space, wherein the line width roughness represents a deviation of a width of the space from a centerline axis along a length of the space; and
identifying which space constitutes the non-mandrel space between the adjacent spacers and the mandrel space based on the line width roughness of the non-mandrel space and the mandrel space, wherein the identifying further includes:
determining whether the line width roughness of a selected space is less than the line width roughness of another, adjacent space,
in response to the line width roughness of the selected space being less than the line width roughness of the another, adjacent space, identifying the selected space as the mandrel space, and
in response to the line width roughness of the selected space not being less than the line width roughness of the another, adjacent space, identifying the selected space as the non-mandrel space.

8. The method of claim 7, wherein the measuring of the line width roughness of each of the non-mandrel space and the mandrel space is accomplished using at least one of: a scanning electron microscope (SEM), an atomic force microscope (AFM), or an optical critical dimension (OCD) tool.

9. The method of claim 7, wherein each of the non-mandrel space and the mandrel space includes a length of approximately 200 nanometers (nm) to approximately 10,000 nm.

10. The method of claim 7, further comprising:
adjusting one of a depositing or an etching of a spacer material of additional spacers in a subsequently fabricated integrated circuit structure based on the identifying.

11. The method of claim 7, wherein the line width roughness is calculated by the following equation:

$$LWR = 3\sqrt{\sigma_{xR}^2 + \sigma_{xL}^2 - 2\text{cov}(x_L, x_R)}$$

wherein LWR represents the line width roughness, $\sigma_{xR}$ represents standard deviation of the line edge roughness of the right edge, $\sigma_{xL}$ represents standard deviation of the line edge roughness of the left edge, and $\text{cov}(x_L, x_R)$ represents is the covariance between the left and right edge.

* * * * *